(12) United States Patent
Langhammer (10) Patent No.: US 8,707,143 B1
(45) Date of Patent: Apr. 22, 2014

(54) MULTIPLICATION-BASED REED-SOLOMON ENCODING ARCHITECTURE

(75) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 13/158,965

(22) Filed: Jun. 13, 2011

(51) Int. Cl.
*H03M 13/03* (2006.01)
*H03M 13/15* (2006.01)
*H04L 1/00* (2006.01)
*G11B 20/18* (2006.01)

(52) U.S. Cl.
CPC ......... *H03M 13/1515* (2013.01); *H04L 1/0057* (2013.01); *G11B 20/1833* (2013.01)
USPC ...................................................... 714/784

(58) Field of Classification Search
CPC .. H03M 13/15; H03M 13/1515; H03M 13/17
See application file for complete search history.

(56) References Cited

U.S. PATENT DOCUMENTS

| | | | |
|---|---|---|---|
| 4,835,775 A * | 5/1989 | Seroussi ........................ | 714/784 |
| 5,886,989 A * | 3/1999 | Evans et al. ................... | 370/347 |
| 6,014,767 A * | 1/2000 | Glaise ........................... | 714/776 |
| 6,151,312 A * | 11/2000 | Evans et al. ................... | 370/338 |
| 6,353,909 B1 * | 3/2002 | Amrany et al. ................ | 714/757 |
| 6,690,739 B1 * | 2/2004 | Mui ............................... | 375/265 |
| 6,694,476 B1 * | 2/2004 | Sridharan et al. ............. | 714/781 |
| 7,178,091 B1 * | 2/2007 | Alon .............................. | 714/784 |
| 7,209,455 B2 * | 4/2007 | Yee et al. .................... | 370/310.1 |
| 7,366,969 B2 * | 4/2008 | Dong et al. .................... | 714/784 |
| 7,559,007 B1 * | 7/2009 | Wilkie .......................... | 714/790 |
| 7,877,672 B2 * | 1/2011 | Dobson ......................... | 714/784 |
| 8,347,192 B1 * | 1/2013 | Langhammer ................ | 714/784 |
| 8,484,541 B1 * | 7/2013 | Anholt ........................... | 714/781 |

* cited by examiner

*Primary Examiner* — Daniel McMahon
(74) *Attorney, Agent, or Firm* — Ropes & Gray LLP; Jeffrey H. Ingerman (57) ABSTRACT

Circuitry for generating a first number of Reed-Solomon check symbols from a second number of input data symbols includes storage for a plurality of generator coefficients, a plurality of multipliers, each of the multipliers having a data symbol input, and a coefficient input connected to the storage, and having an output. The circuitry also includes accumulator circuitry that accumulates outputs of the multipliers to generate the check symbols. The circuitry can be provided in fixed logic, or configured in a programmable integrated circuit device, such as a programmable logic device.

23 Claims, 6 Drawing Sheets

MULTIPLICATION-BASED REED-SOLOMON ENCODING ARCHITECTURE

FIELD OF THE INVENTION

This invention relates to Reed-Solomon encoding, and to circuitry for performing such encoding, particularly in an integrated circuit device such as a programmable logic device (PLD).

BACKGROUND OF THE INVENTION

Most known techniques for Reed-Solomon encoding are based on polynomial division. The direct application of this method allows for calculation of check symbols based on the input of one data symbol at a time. With k symbols in a codeword, k clock cycles are needed to calculate n−k check symbols. By substitution, it may be possible to calculate the check symbols based on the input of a number of data symbols at once, but the feedback nature of such a calculation means that the critical path grows with each additional parallel input symbol, and the encoder operational frequency is decreased quickly.

SUMMARY OF THE INVENTION

The present invention relates to circuitry and methods for generating check symbols for Reed-Solomon encoding using matrix multiplication. The use of multiplication allows Reed-Solomon encoding to run at the maximum device frequency of an FPGA or other PLD, or any other logic device. These techniques have no feedback paths and can be pipelined to any level required to maintain a desired system clock frequency. In addition, any amount of parallelism can be used without affecting the clock frequency of the implementation.

In accordance with these techniques, a coefficient matrix of n−k k×1 "generator vectors" is derived as discussed in more detail below. These generator vectors are multiplied by the data symbols according to one of several embodiments to generate n−k check symbols.

Therefore, in accordance with the present invention, there is provided circuitry for generating a first number of Reed-Solomon check symbols from a second number of input data symbols. The circuitry includes storage for storing a plurality of generator coefficients, a plurality of multipliers, each of the multipliers having a data symbol input, and a coefficient input coupled to the storage, and having an output resulting from multiplying the data symbol input by the coefficient input. The circuitry also includes accumulator circuitry that accumulates outputs of the multipliers to generate the check symbols.

A method of configuring such circuitry on a programmable device, and a machine-readable data storage medium encoded with software for performing the method, are also provided, as is a method of generating Reed-Solomon check symbols.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Reed-Solomon encoding operates over a finite field. The coefficient matrix discussed above may be generated as follows:

First a set of k linearly independent vectors, each of size k, may be created over the selected finite field. Next, each of the k vectors is encoded using Reed-Solomon encoding, which may be implemented using any method, including polynomial division as discussed above. The result is a k×k matrix of data symbols, and a k×(n−k) matrix of check symbols.

The k×k matrix of data symbols is then triangulated to yield an upper triangular matrix. This can be done by simple Gaussian elimination. For larger field sizes, where it may not be possible to avoid zeroes in the next column to be eliminated, pivoting may be used. That is, all rows with a zero in the next column may be moved to the bottom of the matrix. This changing of the order of the non-zero rows will not matter, because field arithmetic is being used. The rows may not actually be moved because doing so may cost too much time; instead, the permutations of the rows may just be kept track of.

Once the triangulated matrix has been generated, back substitution can be used to create a multiplication vector corresponding to each check symbol index. This can be accomplished in n−k separate back substitutions. The result is n−k separate k×1 vectors, which may be referred to as "generator vectors" because, as described below, they are used to generate check symbols from data symbols.

Figure 1:
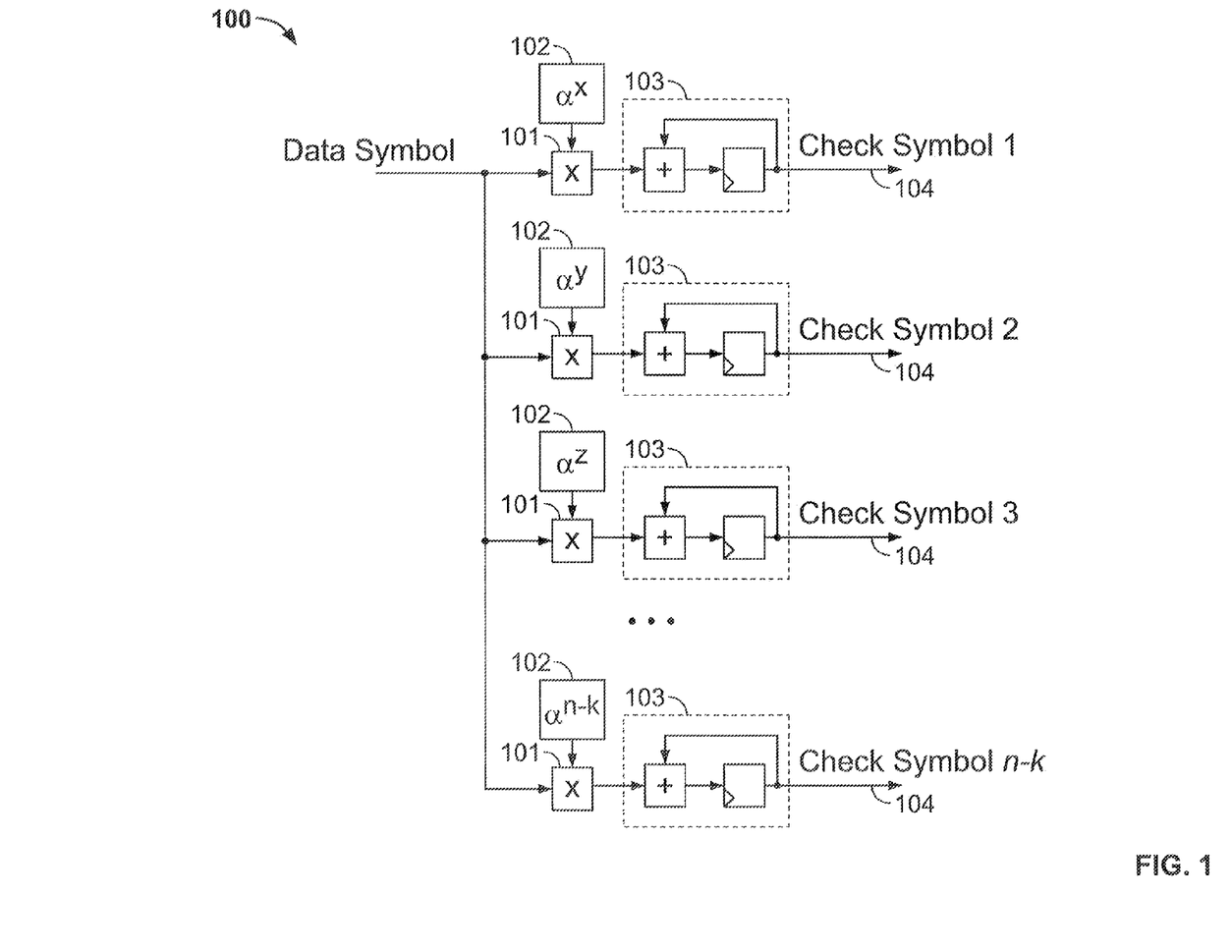
FIG. 1 shows one embodiment of a multiplication-based Reed-Solomon encoder circuit according to the invention.

FIG. 1 shows one embodiment of a multiplication-based Reed-Solomon encoder circuit 100 according to the invention. Circuit 100 includes n−k multipliers 101. Each multiplier 101 has as one of its inputs one of the n−k generator vectors 102 ($\alpha^1, \alpha^2, \alpha^3, \ldots, \alpha^{n-k}$) each of which may be considered to be a respective coefficient table containing k coefficients. The other input of each multiplier 101 is a current data symbol. In one clock cycle, one of the k data symbols of a particular codeword can be processed by multipliers 101. An address generator (not shown) can be used to select the correct index within each generator vector 102. After each clock cycle, the respective n−k multiplication results are accumulated in respective accumulators 103 which, for finite field accumulation, may be implemented by word-wide exclusive-OR operators. After k clock cycles, each of the n−k check symbols for the particular codeword will have been generated and available at outputs 104.

Alternatively, there may be only one multiplier 101 and one accumulator 103. In such a variant, the one multiplier 101 would be used for all check symbols. This will require k(n−k), or kn−k² clock cycles to calculate the n−k check symbols. The n−k generator vectors or coefficient tables can be stored in one or more memories (not shown) and an address generator (not shown) can be provided to access the current coefficient. The check symbols can be stored in registers, or in memories. If the check symbols are stored in memories, then another address generator (not shown) may be provided to write the multiplication result to the current check symbol location. The write operation may be performed in the same clock cycle, or it may be delayed by some number of clock cycles, depending on the latency of the implemented circuit.

In a further variant (not shown), some number of multipliers, greater than one but less than the number of check symbols, could be used, with each multiplier calculating more than one check symbol. Again, the check symbol calculations in progress could be stored in registers or in memories, with proper addressing.

Figure 2:
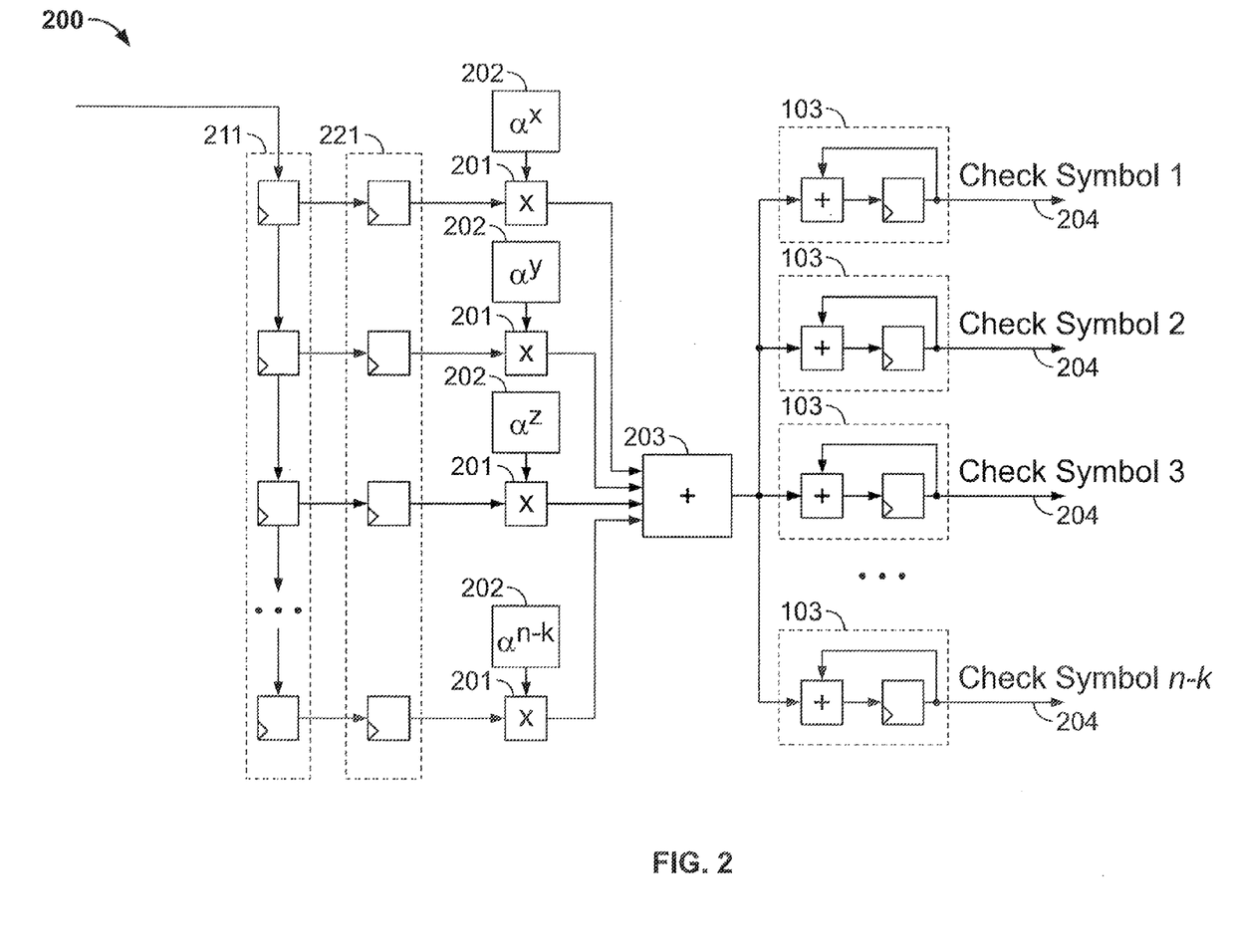
FIG. 2 shows another embodiment of a multiplication-based Reed-Solomon encoder circuit according to the invention.

FIG. 2 shows another embodiment 200 of a multiplication-based Reed-Solomon encoder circuit according to the invention. In circuit 200, the data symbols are clocked into a shift register 211 of length n−k. After n−k clock cycles, n−k data symbols are in shift register 211 and are loaded into a staging register 221 of length n−k. During the next n−k clock cycles the next n−k data symbols are clocked into shift register 211 while the current n−k data symbols remain stable in staging register 221.

The contents of the coefficient tables 202 are arranged differently than coefficient tables 102 of the embodiment described above. Specifically, instead of each coefficient table 202 containing one of the n−k generator vectors, the generator vectors are distributed across the coefficient tables 202. Thus, the first n−k elements of the first generator vector will be spread across the respective index 0 positions of the n−k coefficient tables 202. The first n−k elements of the second generator vector will be spread across the respective index 1 positions of the n−k coefficient tables 202, and so on through the respective index (n−k−1) positions of the n−k coefficient tables 202. The second n−k elements (i.e., elements n−k+1 through 2n−2k) of the first generator vector will be spread across the respective (n−k) positions of the n−k coefficient tables 202. The second n−k elements (i.e., elements n−k+1 through 2n−2k) of the second generator vector will be spread across the respective (n−k+1) positions of the n−k coefficient tables 202, and so on until all k elements of each generator vector are accounted for.

Put another way, for each particular generator vector, successive values of that particular generator vector are stored in corresponding positions in successive ones of the coefficient tables 202. In any particular one of coefficient tables 202, any two values present in that particular one of coefficient tables 202 from any single one of the generator vectors, and having indices in that generator vector differing by n−k, are separated in that particular one of the coefficient tables 202 by a single respective value from each other one of the generator vectors.

It will be apparent that this works best when k is an integer multiple of n−k, but that is not necessary.

In this embodiment, multipliers 201 may be merely partial product generators. On each of the n−k clock cycles that a set of data symbols is held constant in staging register 221, a particular one of the check symbols is updated by multiplying each data symbol by the corresponding index of all coefficient tables. The resulting n−k partial products are summed at 203, which again could be implemented as a wide XOR circuit, and then routed—e.g., by a multiplexer (not shown) to the correct accumulator 103 for the check symbol in question. After n−k clock cycles, all n−k check symbols will have been updated, but the process will repeat, moving data symbols from shift register 211 to staging register 221 and accumulating further updates to each respective check symbol in each respective accumulator 103 over each of the next n−k clock cycles, until k data symbols have been processed, whereupon each of the n−k check symbols for the particular codeword will have been generated and available at outputs 204.

Because of the extra n−k clock cycles needed to load shift register 211 the first time, this embodiment takes n cycles, instead of k cycles, to compute the n−k check symbols. However, while more registers are required (for shift register 211 and staging register 221) than in embodiment 100, the use of partial product generators 201 and a single adder 203 in place of full multipliers 101 can reduce the required logic resources by up to 50%.

In variants of such an embodiment, multipliers can be shared (to reduce the number of multipliers at the cost of decreasing the throughput of the decoder). In one variant, the loading of data symbols can remain the same as described above, but the number of multipliers can be reduced, with the multiplier circuit clocked faster than the data symbol loading. Alternatively, one clock domain could be used for both the loading and calculation, but loading could be interrupted regularly while processing is completed. Either way, the coefficient tables could be multiplexed, or combined and properly addressed.

Figure 3:
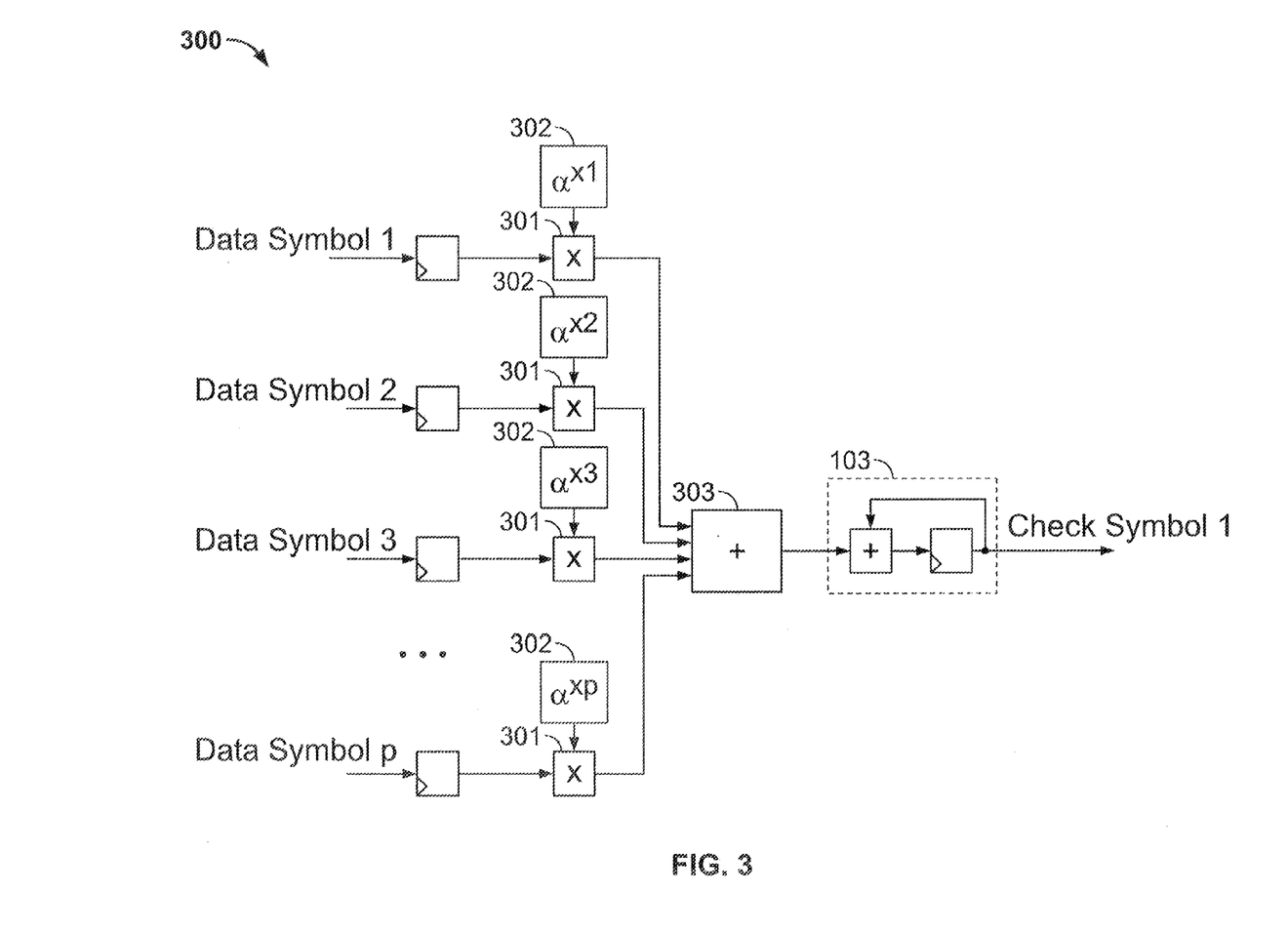
FIG. 3 shows another embodiment of a multiplication-based Reed-Solomon encoder circuit according to the invention.

FIG. 3 shows another embodiment 300 of multiplication-based Reed-Solomon encoder circuitry according to the invention. Circuitry 300 as shown is used to compute one check symbol, and therefore is replicated n−k times (not shown)—once for each check symbol to be computed—and may be operated in parallel. In each instance of circuitry 300, p data symbols, where p≤k, are processed in parallel.

In the simplest case, where p=k, there are k coefficient tables 302 and each includes one coefficient, but the k coefficient tables 302 are different for each instance of circuit 300, reflecting the different generator vectors for the different check symbols. There are also k multipliers 301. The entire check symbol is computed in one clock cycle, with the separate multiplication results, which may be partial products, summed at 303, which again could be implemented as a wide XOR circuit. Because the entire check symbol is computed in one clock cycle, accumulator 103 can be omitted.

In a more likely case, p<k. In such case, p data symbols would be processed in parallel in ceil(k/p) groups (again this works best if k is an integer multiple of p). Similarly, there would be p coefficient tables 302, each with indices between 0 and ceil(k/p)−1, with the first p coefficients in the particular generator vector distributed across the index 0 positions of the p coefficient tables 302, etc. The multiplication results for each of the ceil(k/p) groups would be summed at 303 and accumulated with the multiplication results for all of the other ceil(k/p) groups in accumulator 103.

It will be appreciated that circuit 300 can be pipelined anywhere, to any degree, except for the finite field accumulator 103. However, finite field accumulator 103 ordinarily would be implemented as one 2-input symbol-wide XOR gate, which will run approximately as fast as the maximum frequency the device can support. Therefore, finite field accumulator 103 will not be in the critical timing path.

While known techniques and circuitry for Reed-Solomon encoding using polynomial division can operate at speeds of up to about 2 Gbps, techniques and circuitry according to the present invention may operate at speeds up to about 1 Tbps. Moreover, techniques and circuitry according to the present invention may be more efficient than known techniques and circuitry for Reed-Solomon encoding using polynomial division at very low speeds (e.g., around 1 Mbps).

The embodiments shown above are merely exemplary. These and other configurations in accordance with the invention can be implemented in programmable integrated circuit devices such as programmable logic devices, where programming software can be provided to allow users to configure a programmable device to perform the various multiplications and other operations.

The structures described above also may be provided in fixed logic, in which case the sizes of the various computational components may be fixed to a particular application. Alternatively, the fixed logic circuitry could allow for limited parameterization.

Figure 4:
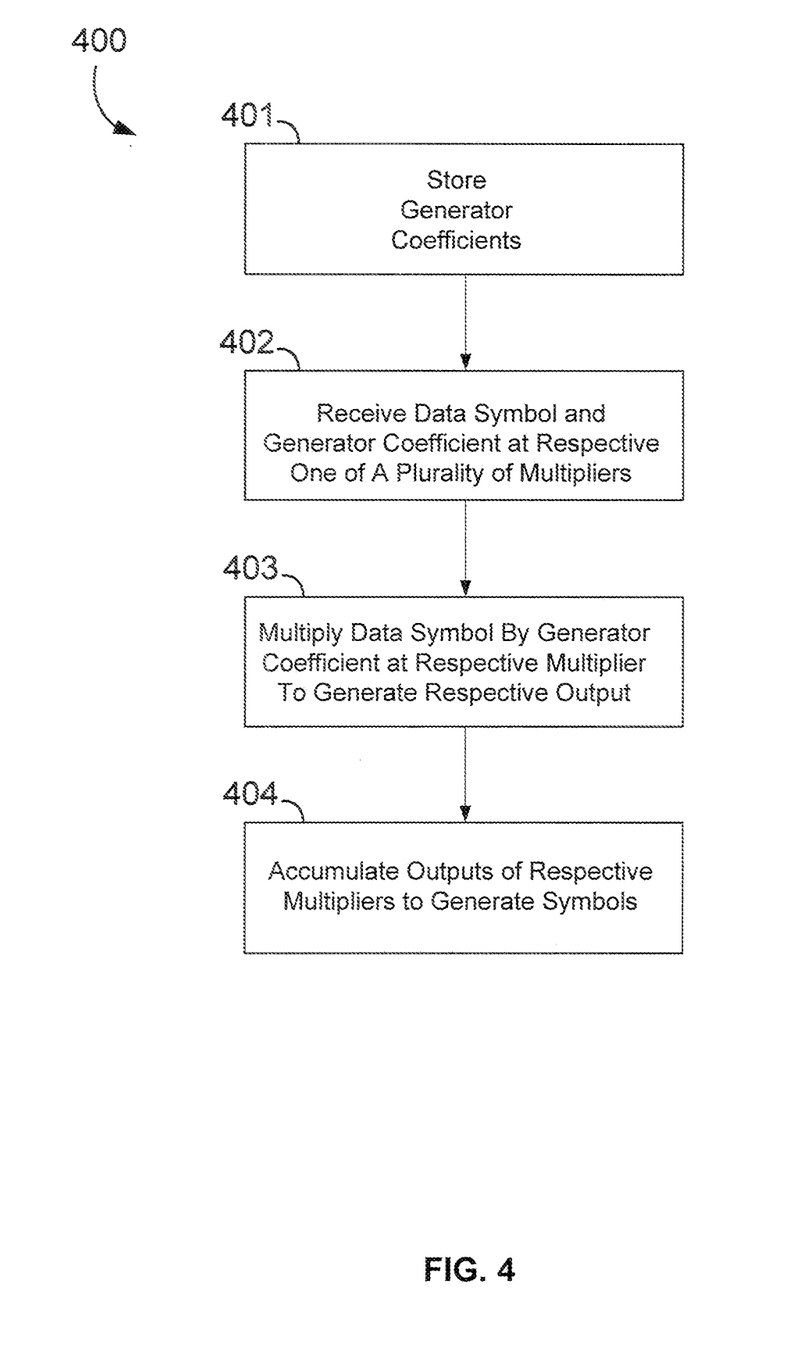
FIG. 4 is a flow diagram of a method of generating Reed-Solomon check symbols in accordance with embodiments of the present invention.

A method 400 according to embodiments of the present invention may be used to perform Reed-Solomon encoding, using circuitry as described above or other circuitry, is diagrammed in FIG. 4. In accordance with method 400, at 401 a plurality of generator coefficients may be stored in a memory component. At 402, a data symbol is received at one input of a multiplier in a plurality of multipliers, and one of the generator coefficients is received (from the memory component) at another input of that multiplier of in the plurality of multipliers. At 403, at each respective multiplier of the plurality of multipliers, the data symbol input is multiplied by the coefficient generator input to generate an output of that respective multiplier. At 404, outputs of the respective multipliers in the plurality of multipliers are accumulated to generate Reed-Solomon check symbols.

Instructions for carrying out a method according to this invention for programming a programmable device to perform Reed-Solomon encoding may be encoded on a machine-readable medium, to be executed by a suitable computer or similar device to implement the method of the invention for programming or configuring PLDs or other programmable devices to perform the operations as described above. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 5:
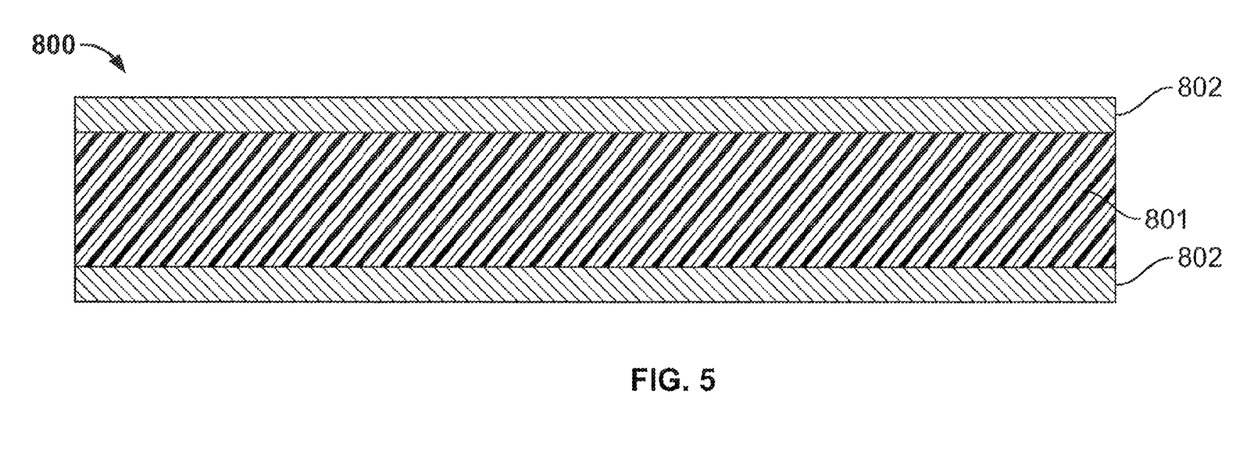
FIG. 5 is a cross-sectional view of a magnetic data storage medium encoded with a set of machine-executable instructions for performing the method according to the present invention.

FIG. 5 presents a cross section of a magnetic data storage medium 800 which can be encoded with a machine executable program that can be carried out by systems such as the aforementioned personal computer, or other computer or similar device. Medium 800 can be a floppy diskette or hard disk, or magnetic tape, having a suitable substrate 801, which may be conventional, and a suitable coating 802, which may be conventional, on one or both sides, containing magnetic domains (not visible) whose polarity or orientation can be altered magnetically. Except in the case where it is magnetic tape, medium 800 may also have an opening (not shown) for receiving the spindle of a disk drive or other data storage device.

The magnetic domains of coating 802 of medium 800 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 6:
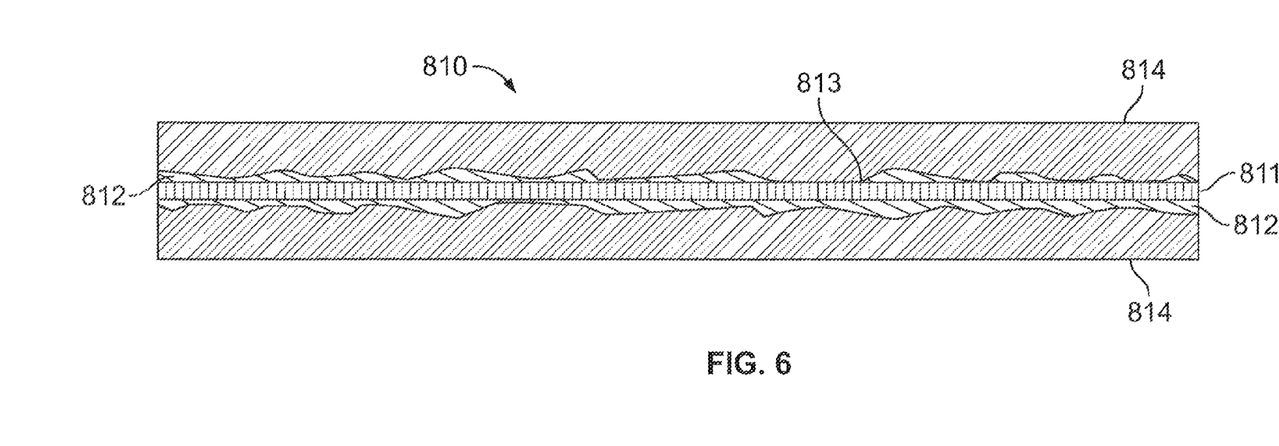
FIG. 6 is a cross-sectional view of an optically readable data storage medium encoded with a set of machine executable instructions for performing the method according to the present invention.

FIG. 6 shows a cross section of an optically-readable data storage medium 810 which also can be encoded with such a machine-executable program, which can be carried out by systems such as the aforementioned personal computer, or other computer or similar device. Medium 810 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 810 preferably has a suitable substrate 811, which may be conventional, and a suitable coating 812, which may be conventional, usually on one or both sides of substrate 811.

In the case of a CD-based or DVD-based medium, as is well known, coating 812 is reflective and is impressed with a plurality of pits 813, arranged on one or more layers, to encode the machine-executable program. The arrangement of pits is read by reflecting laser light off the surface of coating 812. A protective coating 814, which preferably is substantially transparent, is provided on top of coating 812.

In the case of magneto-optical disk, as is well known, coating 812 has no pits 813, but has a plurality of magnetic domains whose polarity or orientation can be changed magnetically when heated above a certain temperature, as by a laser (not shown). The orientation of the domains can be read by measuring the polarization of laser light reflected from coating 812. The arrangement of the domains encodes the program as described above.

A PLD 90 programmed according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

Figure 7:
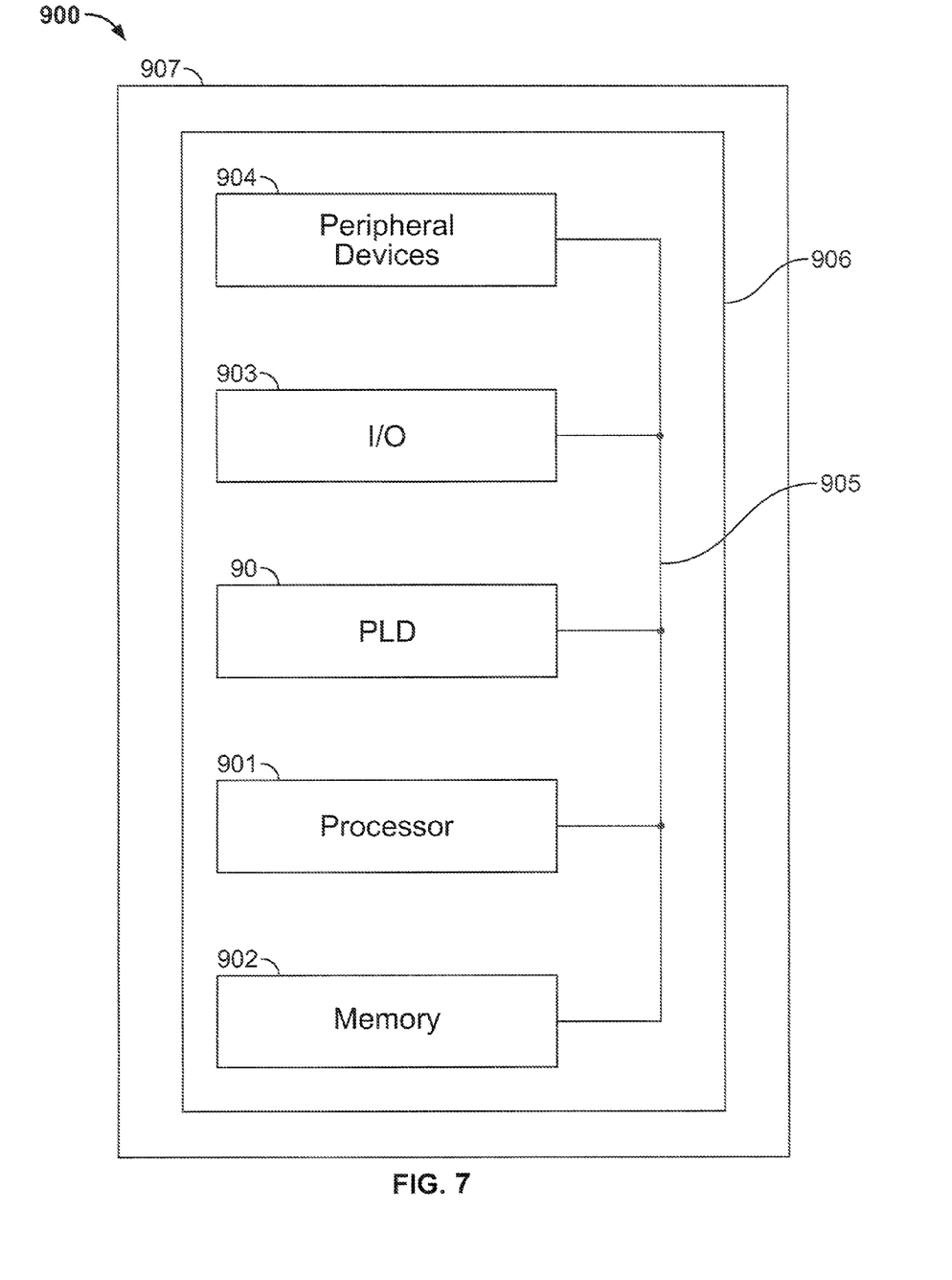
FIG. 7 is a simplified block diagram of an illustrative system employing a programmable logic device incorporating the present invention.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Circuitry for generating a first number of Reed-Solomon check symbols from a second number of input data symbols, said circuitry comprising:

storage for storing a plurality of generator coefficients, said plurality of generator coefficients being grouped into generator vectors equal in number to said first number, each of said generator vectors having values equal in number to said second number;

a plurality of multipliers, each of said multipliers having a data symbol input, and a coefficient input coupled to said storage, and having an output resulting from multiplying said data symbol input by said coefficient input; and accumulator circuitry that accumulates outputs of said multipliers to generate said check symbols; wherein:

respective ones of said input data symbols are input in parallel to respective ones of said data symbol inputs of said plurality of multipliers.

2. The circuitry of claim 1, wherein said accumulator comprises a summer for summing outputs of all of said multipliers.

3. The circuitry of claim 1, wherein:
said storage comprises memories equal in number to said first number, each of said memories storing one of said generator vectors;
said plurality of multipliers is equal in number to said first number; and
said accumulator circuitry comprises a respective finite field accumulator on each respective multiplier output.

4. The circuitry of claim 1 further comprising:
an input shift register having positions equal in number to a third number; and
an input staging register having positions equal in number to said third number, each position being coupled to a data symbol input of a respective multiplier; wherein:
said plurality of multipliers is equal in number to said third number;
said storage comprises memories equal in number to said third number;
said generator vectors are stored across said memories, such that:
successive values of each particular generator vector are stored in corresponding positions in successive ones of said memories, and
in any particular one of said memories, any two values present in said particular one of said memories from any single one of said generator vectors, and having indices in said generator vector differing by said first number, are separated in said particular one of said memories by a single respective value from each of said generator vectors other than said single one of said generator vectors; and
said accumulator circuitry comprises:
a summer for summing outputs of all of said multipliers, and
a number of finite field accumulators equal in number to said first number; wherein on each successive clock cycle of said circuitry:
all of said multipliers multiply respective ones of said input data symbols by respective values from only one successive one of said generator vectors, and said summer sums said outputs of all of said multipliers, and
output of said summer is input to only one successive one of said finite field accumulators.

5. The circuitry of claim 4, wherein:
said third number is equal to said first number;
on each clock cycle, an input data symbol is shifted into said input shift register; and
after each passage of clock cycles equal in number to said first number, input data symbols are transferred from said shift register to said input staging register.

6. The circuitry of claim 4, wherein:
said third number is less than said first number;
on each clock cycle of said circuitry, an input data symbol is shifted into said input shift register;
after each passage of clock cycles equal in number to said third number, input data symbols are transferred from said input shift register to said input staging register; and
said multipliers operate faster than said circuitry by a factor equal to a ratio of said first number to said third number.

7. The circuitry of claim 1 further comprising subcircuits equal in number to said first number, wherein:
each of said subcircuits generates one of said check symbols and comprises a subplurality of said plurality of multipliers equal in number to a third number;
said storage comprises memories equal in number to a product of said first number and said third number, each of said subcircuits comprising a number, equal in number to said third number, of said memories;
each of said generator vectors is stored across said memories in only one of said subcircuits, wherein successive values of each of said generator vectors are stored in successive ones of said memories in said one of said subcircuits; and
said accumulator circuitry comprises:
a respective summer in each respective one of said subcircuits for summing outputs of all of said multipliers in said one of said subcircuits, and
a respective finite field accumulator in each of said subcircuits; wherein on each successive clock cycle of said circuitry:
a number of input data symbols equal in number to said third number is applied in parallel to all of said subcircuits; and
within each of said subcircuits:
each of said multipliers multiplies a respective one of said input data symbols by a respective value from a respective one of said generator vectors, and said summer sums said outputs of all of said multipliers, and
output of said summer is input to said respective finite field accumulator.

8. A method of configuring a programmable integrated circuit device to generate a first number of Reed-Solomon check symbols from a second number of input data symbols, said method comprising:
configuring storage for storing a plurality of generator coefficients, said plurality of generator coefficients being grouped into generator vectors equal in number to said first number, each of said generator vectors having values equal in number to said second number;
configuring a plurality of multipliers, each of said multipliers having a respective data symbol input, and a coefficient input coupled to said storage, and having an output resulting from multiplying said data symbol input by said coefficient input;
configuring inputs for each of said input data symbols to be applied in parallel to the respective data symbol input of each of said multipliers; and
configuring accumulator circuitry that accumulates outputs of said multipliers to generate said check symbols.

9. The method of claim 8, wherein said configuring accumulator circuitry comprises configuring a summer for summing outputs of all of said multipliers.

10. The method of claim 8, wherein:
said configuring storage comprises configuring memories equal in number to said first number, each of said memories storing one of said generator vectors;

said plurality of multipliers is equal in number to said first number; and said configuring accumulator circuitry comprises configuring a respective finite field accumulator on each respective multiplier output.

11. The method of claim 8 further comprising:

configuring an input shift register having positions equal in number to a third number; and configuring an input staging register having positions equal in number to said third number, each position being coupled to a data symbol input of a respective multiplier; wherein:

said plurality of multipliers is equal in number to said third number;

configuring said storage comprises configuring memories equal in number to said third number;

said generator vectors are stored across said memories, such that:

for each particular generator vector, successive values of said particular generator vectors are stored in corresponding positions in successive ones of said memories, and in any particular one of said memories, any two values present in said particular one of said memories from any single one of said generator vectors, and having indices in said generator vector differing by said first number, are separated in said particular one of said memories by a single respective value from each of said generator vectors other than said single one of said generator vectors; and configuring said accumulator circuitry comprises:

configuring a summer for summing outputs of all of said multipliers, and configuring a number of finite field accumulators equal in number to said first number; wherein on each successive clock cycle of said circuitry:

all of said multipliers multiply respective ones of said input data symbols by respective values from only one successive one of said generator vectors, and said summer sums said outputs of all of said multipliers, and output of said summer is input to only one successive one of said finite field accumulators.

12. The method of claim 11, wherein:

said third number is equal to said first number; said method further comprising configuring inputs so that:

on each clock cycle, an input data symbol is shifted into said input shift register, and after each passage of clock cycles equal in number to said first number, input data symbols are transferred from said input shift register to said input staging register.

13. The method of claim 11, wherein:

said third number is less than said first number; said method further comprising:

configuring inputs so that:

on each clock cycle of said circuitry, an input data symbol is shifted into said input shift register, and after each passage of clock cycles equal in number to said third number, input data symbols are transferred from said input shift register to said input staging register; and configuring said multipliers to operate faster than said circuitry by a factor equal to a ratio of said first number to said third number.

14. The method of claim 8 further comprising configuring subcircuits equal in number to said first number, including:

configuring each of said subcircuits to generate one of said check symbols and to comprise a subplurality of said plurality of multipliers equal in number to a third number; and configuring said storage as memories equal in number to a product of said first number and said third number, including configuring in each of said subcircuits a number, equal in number to said third number, of said memories; wherein:

each of said generator vectors is stored across said memories in only one of said subcircuits, wherein successive values of each of said generator vectors are stored in successive ones of said memories in said one of said subcircuits; and configuring said accumulator circuitry comprises:

configuring a respective summer in each respective one of said subcircuits for summing outputs of all of said multipliers in said one of said subcircuits, and configuring a respective finite field accumulator in each of said subcircuits; wherein on each successive clock cycle of said circuitry:

a number of input data symbols equal in number to said third number is applied in parallel to all of said subcircuits; and within each of said subcircuits:

each of said multipliers multiplies a respective one of said input data symbols by a respective values from a respective one of said generator vectors, and said summer sums said outputs of all of said multipliers, and output of said summer is input to said respective finite field accumulator.

15. A non-transitory machine-readable data storage medium encoded with non-transitory machine-executable instructions for configuring a programmable integrated circuit device to generate a first number of Reed-Solomon check symbols from a second number of input data symbols, said instructions comprising:

instructions to configure storage for storing a plurality of generator coefficients, said plurality of generator coefficients being grouped into generator vectors equal in number to said first number, each of said generator vectors having values equal in number to said second number;

instructions to configure a plurality of multipliers, each of said multipliers having a respective data symbol input, and a coefficient input coupled to said storage, and having an output resulting from multiplying said data symbol input by said coefficient input;

instructions to configure inputs for each of said input data symbols to be applied in parallel to the respective data symbol input of each of said multipliers; and instructions to configure accumulator circuitry that accumulates outputs of said multipliers to generate said check symbols.

16. The data storage medium of claim 15, wherein said instructions to configure accumulator circuitry comprise instructions to configure a summer for summing outputs of all of said multipliers.

17. The data storage medium of claim 15, wherein:

said instructions to configure storage comprise instructions to configure memories equal in number to said first number, each of said memories storing one of said generator vectors;

said plurality of multipliers is equal in number to said first number; and said instructions to configure accumulator circuitry comprise instructions to configure a respective finite field accumulator on each respective multiplier output.

18. The data storage medium of claim 15 further comprising:
    instructions to configure an input shift register having positions equal in number to a third number; and
    instructions to configure an input staging register having positions equal in number to said third number, each position being coupled to a data symbol input of a respective multiplier; wherein:
    said plurality of multipliers is equal in number to said third number;
    said instructions to configure said storage comprise instructions to configure memories equal in number to said third number;
    said generator vectors are stored across said memories, such that:
    for each particular generator vector, successive values of said particular generator vectors are stored in corresponding positions in successive ones of said memories, and
    in any particular one of said memories, any two values present in said particular one of said memories from any single one of said generator vectors, and having indices in said generator vector differing by said first number, are separated in said particular one of said memories by a single respective value from each of said generator vectors other than said single one of said generator vectors; and
    said instructions to configure said accumulator circuitry comprise:
    instructions to configure a summer for summing outputs of all of said multipliers, and
    instructions to configure a number of finite field accumulators equal in number to said first number; wherein on each successive clock cycle of said circuitry:
    all of said multipliers multiply respective ones of said input data symbols by respective values from only one successive one of said generator vectors, and said summer sums said outputs of all of said multipliers, and
    output of said summer is input to only one successive one of said finite field accumulators.

19. The data storage medium of claim 18, wherein:
    said third number is equal to said first number; said instructions further comprising instructions to configure inputs so that:
    on each clock cycle, an input data symbol is shifted into said input shift register, and
    after each passage of clock cycles equal in number to said first number, input data symbols are transferred from said input shift register to said input staging register.

20. The data storage medium of claim 18, wherein:
    said third number is less than said first number; said instructions further comprising:
    instructions to configure inputs so that:
    on each clock cycle of said circuitry, an input data symbol is shifted into said input shift register, and
    after each passage of clock cycles equal in number to said third number, input data symbols are transferred from said input shift register to said input staging register; and
    instructions to configure said multipliers to operate faster than said circuitry by a factor equal to a ratio of said first number to said third number.

21. The data storage medium of claim 15 comprising instructions to configure subcircuits equal in number to said first number, including:
    instructions to configure each of said subcircuits to generate one of said check symbols and to comprise a subplurality of said plurality of multipliers equal in number to a third number; and
    instructions to configure said storage as memories equal in number to a product of said first number and said third number, including instructions to configure in each of said subcircuits a number, equal in number to said third number, of said memories; wherein:
    each of said generator vectors is stored across said memories in only one of said subcircuits, wherein successive values of each of said generator vectors are stored in successive ones of said memories in said one of said subcircuits; and
    said instructions to configure said accumulator circuitry comprise:
    instructions to configure a respective summer in each respective one of said subcircuits for summing outputs of all of said multipliers in said one of said subcircuits, and
    instructions to configure a respective finite field accumulator in each of said subcircuits; wherein on each successive clock cycle of said circuitry:
    a number of input data symbols equal in number to said third number is applied in parallel to all of said subcircuits; and
    within each of said subcircuits:
    each of said multipliers multiplies a respective one of said input data symbols by a respective values from a respective one of said generator vectors, and said summer sums said outputs of all of said multipliers, and
    output of said summer is input to said respective finite field accumulator.

22. A method of configuring a programmable integrated circuit device to generate a first number of Reed-Solomon check symbols from a second number of input data symbols, said method comprising:
    storing a plurality of generator coefficients in a memory component, said plurality of generator coefficients being grouped into generator vectors equal in number to said first number, each of said generator vectors having values equal in number to said second number;
    receiving an input data symbol, and an input generator coefficient from said memory component, at each multiplier of a plurality of multipliers;
    inputting each of said input data symbols in parallel to a respective data symbol input of each of said multipliers, and each of said input generator coefficients in parallel to a respective coefficient generator input of each of said multipliers;
    at each respective multiplier of said plurality of multipliers, multiplying said data symbol input by said coefficient generator input to generate an output at said respective multiplier of said plurality of multipliers; and
    accumulating outputs of said respective multipliers of said plurality of multipliers to generate said check symbols.

23. The method of claim 22, wherein:
    said inputting each of said input data symbols comprises transferring each of said input data symbols from a position in an input shift register to said respective data symbol input; and
    said method further comprises shifting said input data symbols within said input shift register and repeating said transferring.

* * * * *